(12) United States Patent
Isa et al.

(10) Patent No.: US 7,875,986 B2
(45) Date of Patent: Jan. 25, 2011

(54) SEMICONDUCTOR DEVICE

(75) Inventors: Satoshi Isa, Tokyo (JP); Mitsuaki Katagiri, Tokyo (JP); Kyoichi Nagata, Tokyo (JP); Seiji Narui, Tokyo (JP)

(73) Assignee: Elpida Memory, Inc., Chou-ku, Tokyo (JP)

( * ) Notice: Subject to any disclaimer, the term of this patent is extended or adjusted under 35 U.S.C. 154(b) by 637 days.

(21) Appl. No.: 11/822,265

(22) Filed: Jul. 3, 2007

(65) Prior Publication Data
US 2008/0012107 A1    Jan. 17, 2008

(30) Foreign Application Priority Data
Jul. 6, 2006    (JP) .............................. 2006-186823

(51) Int. Cl.
*H01L 29/40* (2006.01)
(52) U.S. Cl. .................................................. 257/786
(58) Field of Classification Search ................ None
See application file for complete search history.

(56) References Cited

U.S. PATENT DOCUMENTS

| | | | |
|---|---|---|---|
| 5,153,710 A * | 10/1992 | McCain | 257/724 |
| 6,437,990 B1 * | 8/2002 | Degani et al. | 361/783 |
| 6,921,981 B2 * | 7/2005 | Tien | 257/786 |
| 2003/0117832 A1 * | 6/2003 | Tomishima | 365/149 |
| 2005/0253236 A1 | 11/2005 | Nakayama | |

FOREIGN PATENT DOCUMENTS

| | | |
|---|---|---|
| JP | 8-181247 | 7/1996 |
| JP | 2000-243893 | 9/2000 |
| JP | 2005-117062 | 4/2005 |
| JP | 2005-317830 | 11/2005 |
| JP | 2005-322814 | 11/2005 |

OTHER PUBLICATIONS

Japanese Office Action dated Jun. 18, 2008, with English language translation.

* cited by examiner

*Primary Examiner*—Scott B Geyer
(74) *Attorney, Agent, or Firm*—McGinn IP Law Group, PLLC (57) ABSTRACT

Disclosed is a semiconductor memory device in which pads on a chip which are wire-bonded to lands for solder-balls of a package, respectively, are arranged on first and second sides of the chip facing to each other and are disposed on a third side of the chip as well. Four sets of the pads for data signals are respectively disposed on four regions obtained by dividing the first and second sides into the four regions. Pads for command/address signals are arranged on the third side, thereby increasing layout space for bond fingers for the data signals and achieving uniformity in wiring for data signals.

20 Claims, 8 Drawing Sheets

SEMICONDUCTOR DEVICE

REFERENCE TO RELATED APPLICATION

The present application is claiming the priority of the earlier Japanese patent application No. 2006-186823 filed on Jul. 6, 2006, the entire disclosure thereof being incorporated herein by reference thereto.

FIELD OF THE INVENTION

The present invention relates to a semiconductor device. More specifically, the invention relates to a configuration of pads on a semiconductor chip and a substrate.

BACKGROUND OF THE INVENTION

Figure 5:
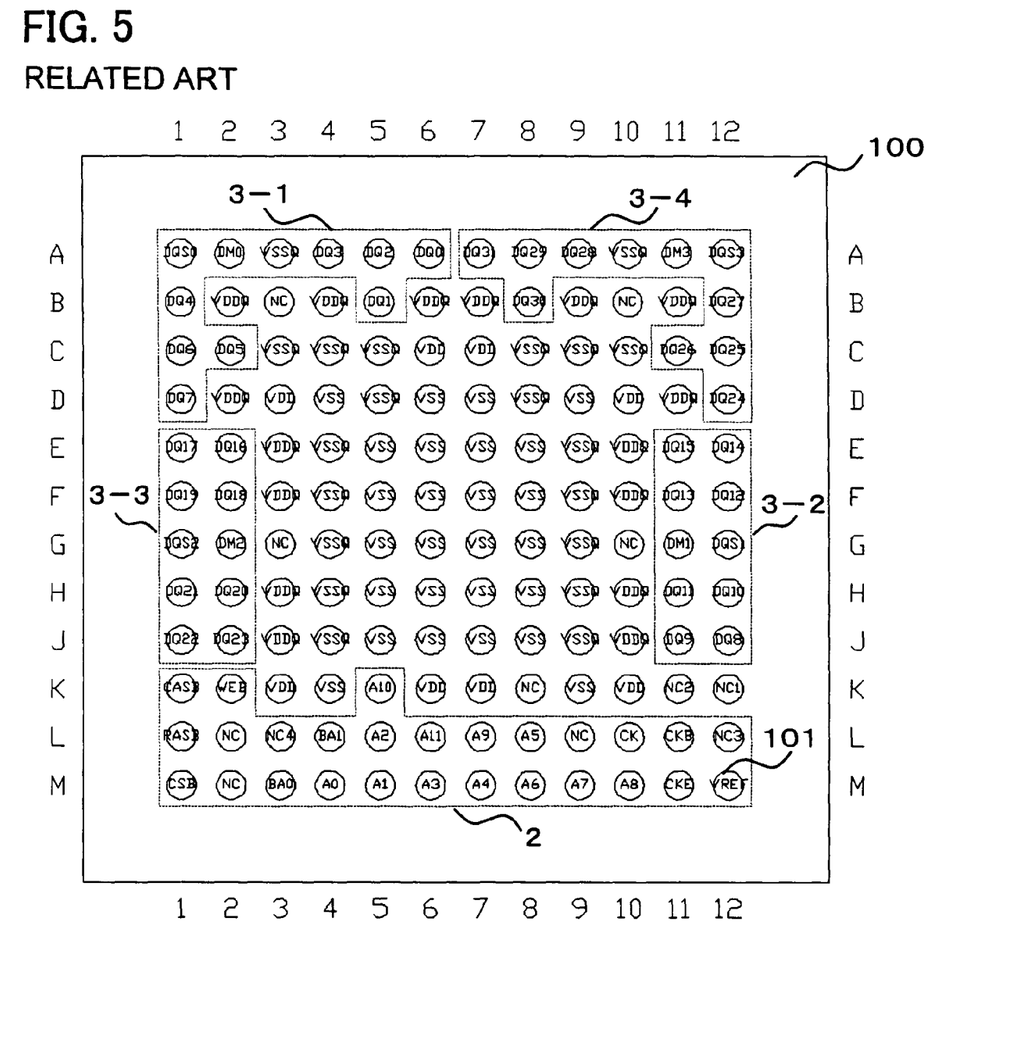
FIG. 5 is a diagram showing pin arrangement in a DDR DRAM semiconductor device.

FIG. 5 is a plan view showing an example of pin arrangement of a BGA (Ball Grid Array) package substrate. FIG. 5 shows a solder-ball(electrode)-attached surface of a substrate 100 of a 144 (12×12)-pin BGA package with a 0.8-mm ball pitch (just referred to as a "substrate" as well) for a 64M/128M bit (×32) DDR (Double Data Rate) SDRAM (Synchronous DRAM)/SGRAM (Synchronous Graphic DRAM) defined by the JEDEC (Joint Electron Device Engineering Council).

Four sets of terminals (pins) for data signals are arranged in regions 3-1, 3-2, 3-3, and 3-4 on three sides of the substrate 100 on a peripheral side, respectively. Each set of the terminals is constituted from eight DQ terminals (DQ0 to DQ7, DQ8 to DQ15, DQ16 to DQ23, or DQ24 to DQ31) for performing input and output of data signals of eight bits, a DQS terminal for performing input and output of a data strobe signal, and a DM terminal for performing input of a DQ write mask signal. In a region 2 on a lower side of FIG. 5, command/address terminals (pins) constituted from the terminals for control signals of a differential pair of clock signals (CK, CKB), a clock enable signal (CKE), a chip select signal (CSB), a row address strobe signal (RASB), a column address strobe signal (CASB), a write enable signal (WEB), address signals (A0 to A11), and bank select signals (BA0, BA 1) are provided. In an internal region, terminals for power supplies VDD/VSS and VDDQ/VSSQ, and a reference voltage VREF are arranged. Power supplies VDDQ and VSSQ are an I/O buffer high-potential power supply and an I/O buffer low-potential power supply, respectively.

Figure 6:
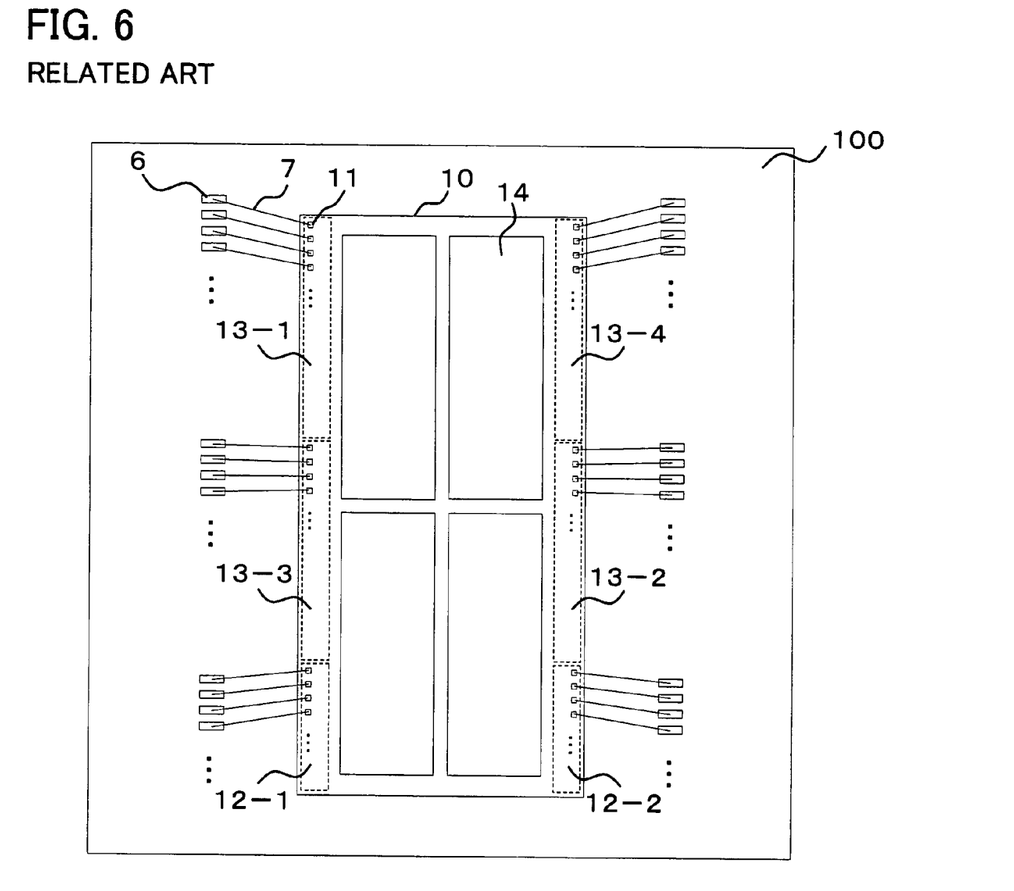
FIG. 6 is a diagram showing a package substrate with a chip mounted thereon.

FIG. 6 is a plan view showing a typical example of a surface (a chip-mounted surface) of the substrate 100 in a state where a 64M/128M bit (×32) DDR DRAM chip 10 has been placed on the substrate 100 and wire bonding has been performed on the substrate 100. As shown in FIG. 6, four memory cell arrays 14 are provided, and four sets of pad regions 13-1 and 13-3 and pad regions 13-2 and 13-4 for the data signals are arranged on both longitudinal sides of the rectangular chip 10. Pad regions 12-1 and 12-2 for command/address signals are also disposed on the both longitudinal sides of the rectangular chip 10.

Figure 8:
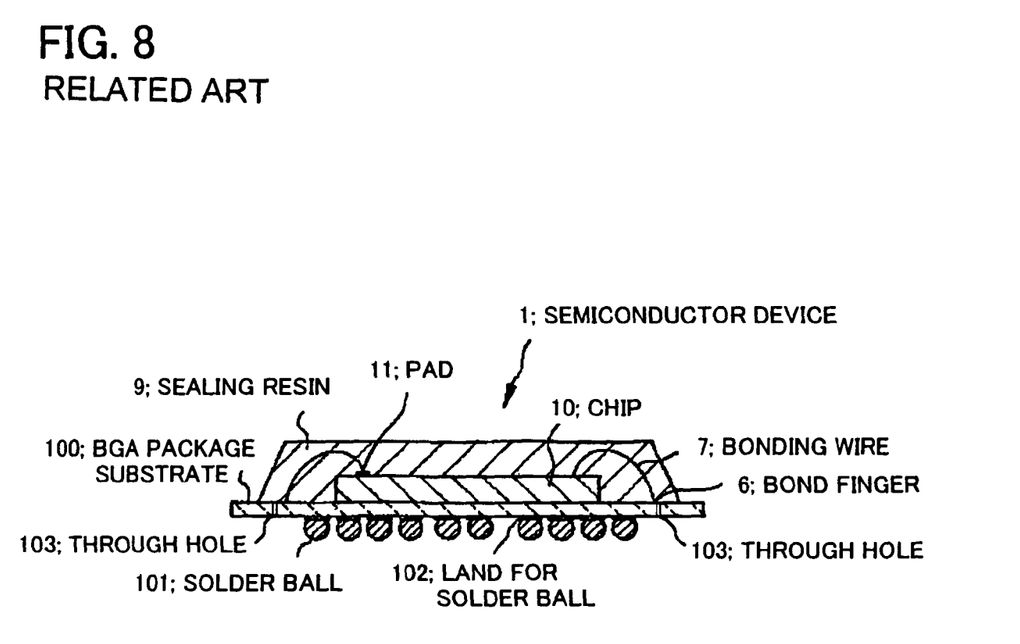
FIG. 8 is a diagram schematically showing a section of a configuration of the semiconductor device.

An array of bond fingers 6 is aligned and arranged on each of right and left sides of the surface of the substrate 100, with each bond finger corresponding to each pad 11 of the chip 10. The pad 11 of the chip 10 is electrically connected to a corresponding bond finger 6 on the surface of the substrate 100 by a bonding wire 7. As schematically shown in FIG. 8, a printed substrate formed of two conductive layers with a dielectric layer (insulating layer) interposed therebetween is employed as this substrate 100. Then, on a surface opposite to the chip-mounted surface, there is provided a land 102 with a solder ball 101 placed thereon. The land 102 on a surface opposite to the chip-mounted surface of the substrate 100 is electrically connected to the chip-mounted surface via a through hole 103 and connected to a corresponding one of the bond fingers 6. As shown in FIG. 8, the chip-mounted surface of the semiconductor device is sealed by an insulating resin (a sealing resin) 9.

In a semiconductor device, as shown in FIG. 6, the pads 11 on the chip 10 are arranged on both of right and left sides of the chip 10, respectively, and corresponding to the arrangement of the pads 11, the bond fingers 6 are aligned and arranged on both of right and left sides of the surface of the substrate 100, respectively.

Figure 7:
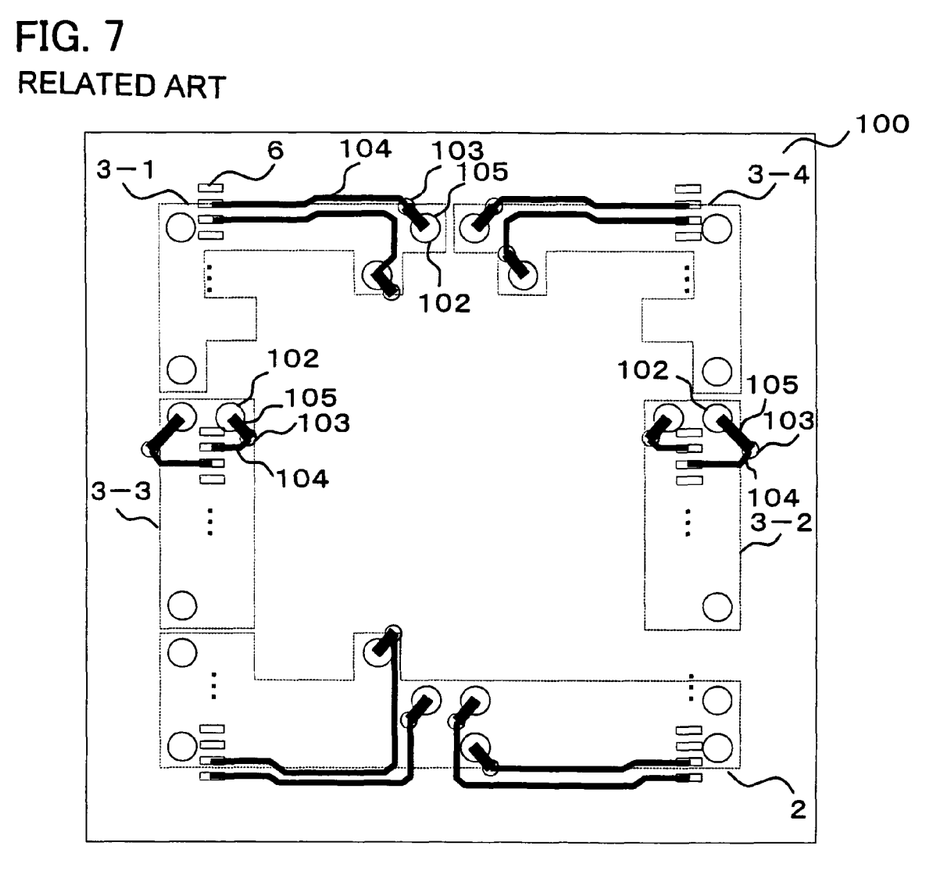
FIG. 7 is a diagram showing two layer patterns of the package substrate, in superimposed manner.

FIG. 7 shows a reference example of superimposed layouts of two layers of the chip-mounted surface and an electrode-mounted surface of the substrate 100. FIG. 7 illustrates wiring (interconnection) patterns, each extending from the land for solder-ball 102 on the back side of the substrate to the bond finger 6 on the surface of the substrate via a through hole 103. Referring to FIG. 7, reference numeral 102 denotes the land for solder-ball on the back side of the substrate 100, reference numeral 103 denotes the through hole that electrically connects the back side of the substrate to the surface of the substrate, reference numeral 104 denotes a wiring pattern extending from a through hole land on the surface of the substrate to the bond finger 6, and reference numeral 105 denotes a wiring pattern extending from the land for solder-ball 102 on the back side of the substrate to the through hole land on the back side. Reference numerals 3-1, 3-2, 3-3, and 3-4 denotes regions for arranging four sets of terminals for the data signals (corresponding to DQ0 to DQ7, DQ8 to DQ15, DQ16 to DQ23, and DQ24 to DQ31 in FIG. 5, respectively). Reference numeral 2 denotes a terminal region for the command/address.

As shown in FIG. 7, referring to signal wiring for data signals in each of the regions 3-1 to 3-4, the signal wiring is once led out from the land for solder-ball 102 on the back side of the substrate in a diagonally lateral direction in FIG. 7 via the wire (conductive layer pattern) 105, connected to the through hole 103, and led out to the surface (chip-mounted surface) of the substrate, and is connected to the corresponding bond finger 6 among the bond fingers 6 aligned on either side of the substrate, via the wire (conductive layer pattern) 104.

As shown in FIG. 7, according to a distance between the land for solder-ball 102 on the back side of the substrate and the corresponding bond finger 6 on the surface of the substrate, an approximate wiring length is determined.

Then, as shown in FIG. 7 as well, it can be seen that a difference between maximum and minimum values of wiring lengths for the data signals is large. Specifically, on the back side of the substrate, no significant difference of a length of the wire 105 between the land for solder-ball 102 and the through hole land is recognized (among the regions 3-1 to 3-4). However, a difference of a length of the wire 104 from the through hole land on the surface (chip-mounted-surface) of the substrate to the bond finger 6 is large (among the regions 3-1 to 3-4). A ratio of the maximum value of the length of the wiring between the land for solder-ball 102 and the bond finger 6 in the regions 3-1 and 3-4 to the minimum value of the length of the wiring between the land for solder-ball 102 and the bond finger 6 in the regions 3-2 and 3-3 amounts even close to a digit (10 times), exceeding several times, for example.

Such non-uniformity in the wiring lengths is caused by constraints such as a relationship between assignment of the pins (solder balls) shown in FIG. 5 and arrangement of the pads on the chip 10 in FIG. 6 and the two-layered substrate. That is, one array of the bond fingers 6 is disposed in either side on the chip-mounted surface of the substrate 100. Since a density of wires 104 led out in a lateral direction (a direction orthogonal to a direction in which the bond fingers 6 are arranged) is relatively high, there is no allowance for expanding a space between the bond fingers 6. Accordingly, a sufficient space for adjusting a wiring length is no longer left. The extremely short wire 104 connected to the bond finger 6, which is connected to the land 102 via the through hole 103 in each of the regions 3-2 and 3-3 shows that it is the only way to enable wiring. In other words, in view of an arrangement relationship between the adjacent bond fingers 6, no extra layout space for extending the wire 104 is left.

Even if a difference between the maximum and minimum values of the wiring lengths for data (DQ) signals in a package is as shown in FIG. 7, a difference among propagation delay times of the signals is on the order of picoseconds. When the semiconductor device is not applied to achieve a high-speed transfer rate, the difference among the propagation delay times of the DQ signals will not manifest itself as a problem. However, in a DDR DRAM with a transfer rate of several hundred MHz, for example, uniformity in the wiring lengths for the DQ signals in the package is desired.

Further, as a support for a faster operation of the DDR DRAM, enhancement of the power supplies VDD/VSS and VDDQ/VSSQ in the DQ signals is required. More specifically, power supply pads are disposed in each of the pad regions 13-1 to 13-4 of the chip in FIG. 6, and are wire bonded to the corresponding bond fingers 6, respectively. Enhancement of the power supplies VDD/VSS and VDDQ/VSSQ of the DQ signals means an increase in the number of the bond fingers 6 for the power supplies. No free region for adding another additional bond fingers to the arrays of the bond fingers 6 is left so as to achieve this purpose.

SUMMARY OF THE DISCLOSURE

As described above, it is difficult to achieve uniformity in the wiring lengths for the data signals within the substrate of the package. It is substantially impossible to achieve uniformity in the wiring lengths of four sets of wiring for the data signals, using pad arrangement in FIG. 6 and pin arrangement in FIG. 5.

Further, no layout space for adding another additional bond finger on the substrate is left, either.

Structural constraints as described above have become a factor for hindering achievement of the faster operation of the DDR DRAM. A breakthrough is therefore desired.

Accordingly, it is an exemplary object to provide a semiconductor device including a semiconductor chip and a substrate with the semiconductor chip mounted thereon, which allows achievement of uniformity in wiring length for data signals and allows for high-speed operation.

The above and other objects are attained by a semiconductor device according to one aspect of the present invention which includes: a semiconductor chip; and a substrate with said semiconductor chip mounted thereon; wherein said semiconductor chip includes: a first region for pads for data signals and a second region for pads for data signals being arranged on a first side and a second side of said semiconductor chip, respectively, among first to fourth sides of said semiconductor chip, said first side and said second side of said substrate chip facing to each other; and a region for pads for command/address signals being arranged on a third side of said semiconductor chip; said pads on said semiconductor chip electrically connected to corresponding bond fingers on a chip-mounted surface of said substrate by bonding wires, respectively; and wherein said substrate includes: a first array of bond fingers and a second array of said bond fingers being arranged on the chip-mounted surface of said substrate, corresponding to said first and second regions for pads for data signals on said first and second sides of said semiconductor chip, respectively; and a group of said bond fingers being arranged on the chip-mounted surface of said substrate, corresponding to said region for pads for command/address signals on said third side of said semiconductor chip.

In the semiconductor device according to the present invention, the substrate is constituted from a printed board formed of two conductive layers, and a land for mounting an electrode is connected to a through hole via a wiring pattern, on a surface opposite to said chip-mounted surface; and the land is electrically led out to the chip-mounted surface via the through hole, and is connected to a corresponding one of the bond fingers via a wiring pattern on the chip-mounted surface.

In the semiconductor device according to the present invention, the region for pads for data signals is divided into plural sets of pad regions for the data signals for each predetermined number of bits of data signals of a plurality of bits, and the plural sets of pad regions for the data signals are symmetrically arranged on the first and second sides of the semiconductor chip, respectively.

In the semiconductor device according to the present invention, the pad regions for the data signals may be extended from the first and second sides to a part of at least one of the third and fourth sides. In the present invention, the region for pads for command/address signals may be extended from the third side to a part of at least one of the first and second sides.

[Pads for Data Signals]

In a semiconductor memory device according to other aspect of the present invention, among first through fourth sides of the device chip, each of at least the first and second sides facing to each other includes a region for pads for data signals; and the third side of the chip includes a region for pads for command/address signals.

The semiconductor memory device according to the present invention may further include: a region for pads for data signals in at least one of a region on the third side extending from an end of the first side toward the second side by a predetermined length and a region on the third side extending from an end of the second side toward the first side by the predetermined length.

In the present invention, the semiconductor memory may further include: a region for pads for data signals in at least one of a region on the fourth side extending from an end of the first side toward the second side by a predetermined length and a region on the fourth side extending from an end of the second side toward the first side by the predetermined length, the fourth side facing the third side.

The semiconductor memory device according to the present invention may include: a region for pads for control signals and the address signals in at least one of a region on the first side extending from an end of the third side toward the fourth side by a predetermined length and a region on the second side extending from an end of the third side toward the fourth side by the predetermined length, the fourth side facing the third side.

In the semiconductor memory device according to the present invention, the region for pads for data signals is divided and arranged on the first and second sides of the chip, respectively.

A semiconductor device according to the present invention includes: a substrate formed of two layers with the semiconductor memory mounted thereon. A first layer of the substrate includes: lands for electrodes, respectively. A second layer of the substrate includes: bond fingers wire bonded to pads of the semiconductor memory, respectively. The lands for electrodes on the first layer are electrically led out to the second layer via through holes, respectively, and are connected to corresponding ones of the bond fingers, respectively.

The present invention may include: an additional bond finger corresponding to at least one of the first and second sides of the chip; a power supply for an input/output circuit for the data signals being supplied to the additional bond finger.

In the present invention, a difference between maximum and minimum values of wiring lengths from the lands for electrodes to corresponding ones of the bond fingers for data signals is more reduced than in a case where pad regions for the data signals and a region for pads for command/address signals are both provided on each of the first and second sides of the chip facing to each other.

The meritorious effects of the present invention are summarized as follows.

According to the present invention, the pads for command/address signals are disposed on the third side of the chip, thereby providing allowance for pad arrangement regions for the data signals on the first and second sides of the chip. Uniformity in the wiring lengths of wiring for the data signals may be thereby achieved, and support for a high-speed transfer rate is also thereby facilitated.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

EXAMPLES OF THE INVENTION

Figure 1:
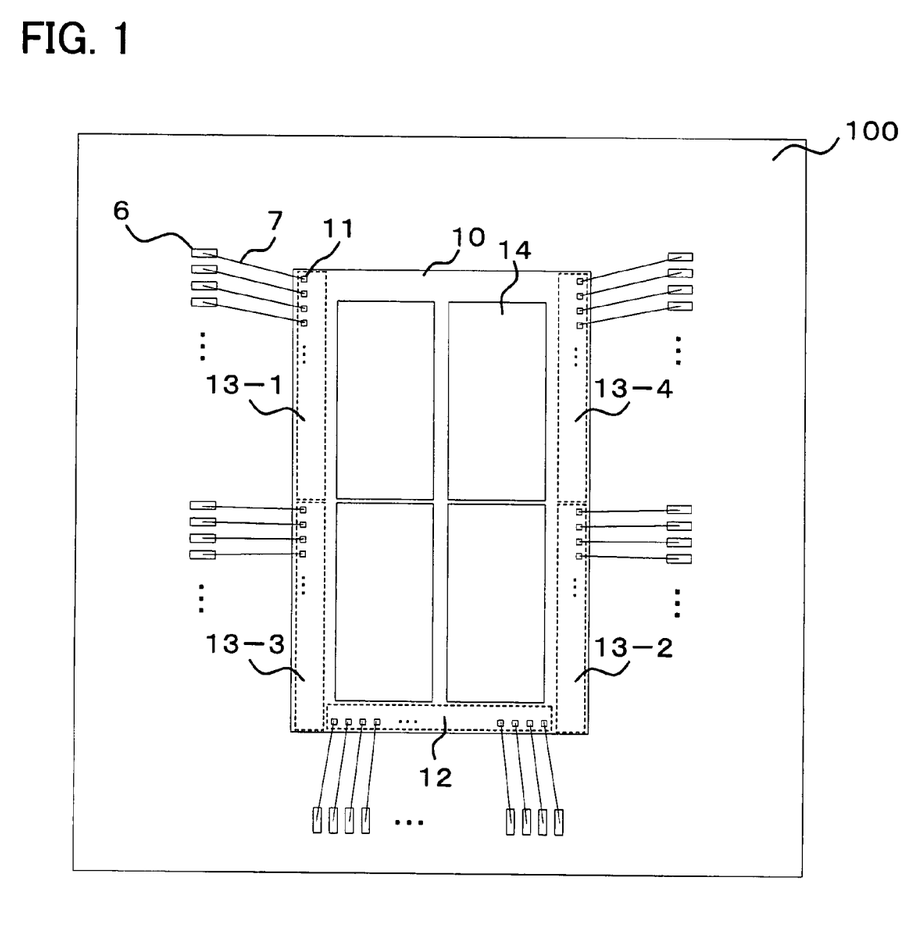
FIG. 1 is a diagram showing a configuration of an example of the present invention.

The detailed disclosure of the invention will be given below with reference to appended drawings. Referring to FIG. 1, in the present invention, with respect to pads (11) on a semiconductor chip (10) which are electrically connected to associated bond fingers (6) on a chip-mounted surface of a substrate (100) on which the semiconductor chip (10) is mounted, pad regions (13-1 and 13-3) and pad regions (13-4 and 13-2) for data signals are arranged on first and second sides of the semiconductor chip which are opposed to each other, respectively, from among the first and second sides, a third side, and a fourth side of the semiconductor chip. A pad region (12) for command/address signals is disposed on the third side. First and second arrays of bond fingers (6) are arranged on the chip-mounted surface of the substrate (100), corresponding to the pad regions (13-1, 13-3) for the data signals on the first side and the pad regions (13-2, 13-4) for data signals on the second side, respectively. A group of the bond fingers is disposed, corresponding to the pad regions (12) for command/address signals on the third side of the semiconductor chip.

Figure 2:
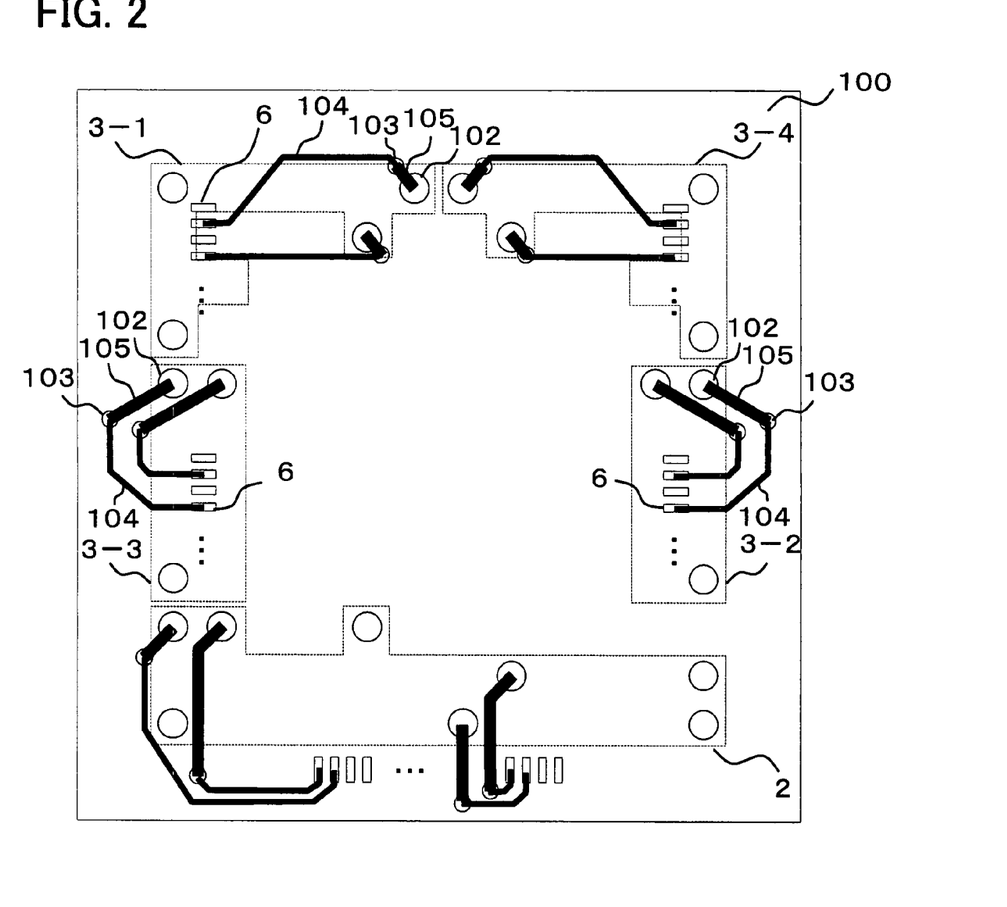
FIG. 2 is a diagram showing two layer patterns of a package substrate in the example of the present invention, in superimposed manner.

The substrate (100) is a printed substrate formed of two conductive layers. Referring to FIG. 2, on a surface opposite to the chip-mounted surface, a wiring pattern (105) is routed to connect a land (102) for an electrode with a land for a through hole (103). The land (102) for an electrode on a surface opposite to the chip-mounted surface is electrically led out to the chip-mounted surface side via the through hole (103). On the chip-mounted surface, a wiring pattern (104) is routed to connect the through hole (103) with a corresponding bond finger (6). Thus, there is made connection between the land (102) on a surface opposite to the chip-mounted surface and the bond finger (6) on the chip-mounted surface. A region for pads for data signals of a plurality of bits (DQ0 to DQ31) is divided into pad regions (13-1 to 13-4) for the data signals for each predetermined number of bits. The pad regions for the data signals are respectively arranged on the first and second sides of the chip, which are opposed to each other, symmetrically.

According to the present invention configured as described above, space is generated in an interval between the bond fingers (6) arranged for the data signals. The degree of freedom in layout of a wiring pattern from a through hole land to the bond finger (6) will thereby increase. A difference between maximum and minimum values of wiring lengths for the data signals is reduced, which contributes to achievement of uniformity in wiring lengths and propagation delay times.

Though no particular limitation is imposed, in the following examples, a description will be directed to an example where the invention is applied to a substrate of a 144 (12× 12)-pin BGA package with a 0.8-mm ball pitch for a 64M/128M bit (×32) DDR (Double Data Rate) SDRAM (Synchronous DRAM)/SGRAM (Synchronous Graphic DRAM) defined by the JEDEC (Joint Electron Device Engineering Council). This is because not only use of this example is effective in order to contrast an operation and effect of the present invention with a related art, but also it has been confirmed that carrying out the present invention in the package of such specifications was actually suitable. Accordingly, in the following examples, an arrangement and a configuration of pins on a solder-ball(electrode)-mounted surface of the substrate 100 of the BGA package (referred to as the "substrate") are identical to those shown in FIG. 5. Further, as shown in FIG. 8, the substrate 100 is set to be a printed board formed of the two layers.

FIG. 1 is a plan view of the chip (DDR DRAM) and the substrate of the package, including the chip, after a wire bonding step, according to an example of the present invention.

Referring to FIG. 1, the pads 11 are arranged on the three sides of the chip 10. The bond fingers 6 are disposed on three sides of the substrate 100, corresponding to the pads 11 on the three sides of the chip. The DQ pad regions 13-1 and 13-3 and the DQ pad regions 13-2 and 13-4 are disposed on the first and second sides (longer sides) of the chip 10, respectively, and the command/address pad region 12 is disposed on the third side (shorter side) of the chip 10.

More specifically, in a semiconductor device in which parallel input and output of data signals of a total of 32 bits consisting of 8 bits×4 (DQ0 to DQ7, DQ8 to DQ15, DQ16 to DQ23, and DQ24 to DQ31) are performed, the region 13-1 located in an upper half portion of the first longer side includes the pads for 8-bit data DQ0 to DQ7, and the region 13-2 located in a lower half portion of the second longer side includes the pads for 8-bit data DQ8 to DQ15. The region 13-3 located in a lower half portion of the first longer side includes the pads for 8-bit data DQ16 to DQ23, and the region 13-4 located in an upper half portion of the second longer side includes the pads for 8-bit data DQ24 to DQ31. The region 12 on the third side (shorter side) includes the pads for command/address signals which includes control signals such as a differential clock signal pair (CK, CKB), a clock enable signal (CKE), a chip select signal (CSB), a row address strobe signal (RASB), a column address strobe signal (CASB), and a write enable signal (WEB), address signals (AO to All), and bank select signals (BA0, BA1).

According to this example, the DQ pad regions 13-1, 13-2, 13-3, and 13-4 are arranged using all of the two longer sides of the chip 10. Then, two arrays of the bond fingers 6 are disposed on both of right and left sides of the chip-mounted surface of the substrate 100, respectively, with the chip 10 interposed therebetween, corresponding to arrays of the DQ pads 11, respectively. Margin is thereby generated in space where the DQ bond fingers 6 are arranged.

Further, according to this example, the bond fingers 6 corresponding to the pads 11 for command/address signals are arranged on a lower side of the substrate. For this reason, there is no need to lead out wires for command/address signals in a lateral direction. Layout space for DQ signal wiring is correspondingly increased. On contrast therewith, in an example shown in FIGS. 6 and 7 as a related art, the bond fingers 6 for command/address signals are also arranged on both sides of the substrate, together with the bond fingers 6 for DQ signals. For this reason, it is necessary to lead out the wires in the lateral direction, which imposes a strict requirement on DQ wiring.

In this example, using the increased layout spaces, it becomes possible to adjust wiring lengths (propagation delay times) for DQ signals of each eight bits. Further, it also becomes possible to adjust wiring lengths of all DQ signals, as necessary.

FIG. 2 is a diagram for explaining this example, and is the diagram showing superimposed layouts of front and back surfaces of the substrate. As a pattern of wiring, connection is made from the land for solder-ball 102 to the corresponding bond finger 6 via the through hole 103.

The regions 3-1, 3-2, 3-3, and 3-4 in FIG. 2 show four regions of the solder—ball—mounted surface, where DQ terminals are arranged, respectively. The regions 3-1, 3-2, 3-3, and 3-4 corresponds to regions 3-1, 3-2, 3-3, and 3-4 in FIG. 5, respectively. On a back side of the substrate, the wire (conductive layer pattern) 105 from the land for solder-ball 102 is connected to the through hole and land. Then, the wire (conductive layer pattern) 104 from the through hole and land on the surface is connected to a corresponding bond finger 6.

As shown in FIG. 2, according to a distance between the land for solder-ball 102 on the back side of the substrate and the corresponding bond finger 6 on the surface (chip-mounted surface) of the substrate, an approximate wiring length is determined.

As clear from comparison between FIG. 2 and FIG. 7, a difference between maximum and minimum values of the wiring lengths for DQ signals in this example is more reduced than in the example in FIG. 7.

This is because, in this example, a wiring length for each of the DQ terminals (DQ8 to DQ15) in the region 3-2 and the DQ terminals (DQ16 to DQ23) in the region 3-3 is set to be longer than that in FIG. 7. More specifically, a length of the wire 105 that connects the land for solder-ball 102 and the corresponding through hole 103 in each of the DQ terminal regions 3-2 and 3-3 on the back side of the substrate and a length of the wire 104 that connects the through hole 103 and the bond finger 6 on the surface of the substrate are set to be longer than those in regions 3-2 and 3-3 in FIG. 7. The DQ pads are disposed on the first and second sides of the chip 10, which are left and right sides of the chip 10, respectively. Then, the command/address pads are disposed on the third side of the chip 10. Free spaces for layout are thereby increased on both of the right and left sides of the substrate, thus bringing about these increases in the lengths of the wires.

The command/address pads are disposed on the third side of the chip 10 in this example. A layout pattern for a peripheral circuit of a memory within the chip 10 thereby needs to be somewhat modified, compared with a case where the command/address pads are disposed on the longer sides together with the DQ pads. However, there was no problem in actual circuit design. In this example, since a circuit for command/address signals is disposed on a side of the third side of the chip, a chip size (a length of the longer side) slightly increases.

Figure 3:
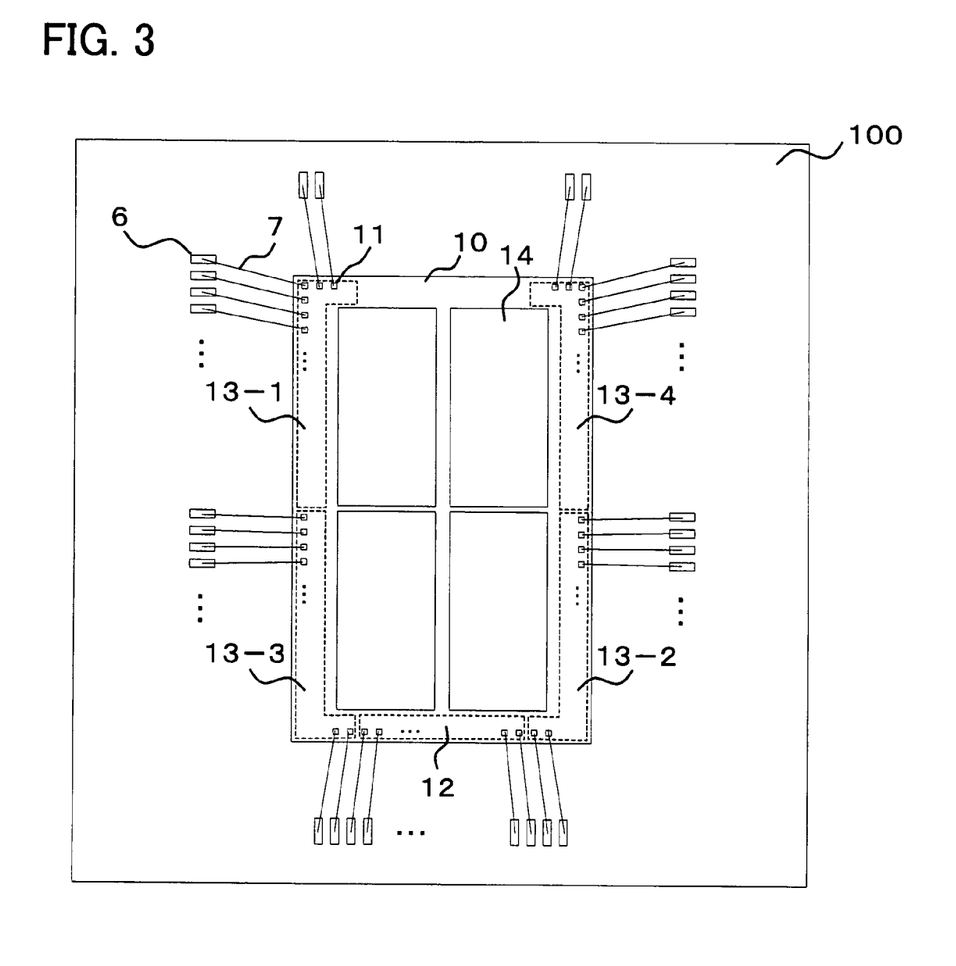
FIG. 3 is a diagram showing a configuration of a second example of the present invention.

FIG. 3 is a diagram showing a configuration of a second example of the present invention. As shown in FIG. 3, in this example, the DQ pad regions are extended to parts of regions on the shorter side, respectively, in addition to the regions on the first and second sides (longer sides) that are opposed to each other. More specifically, a region on the third side (shorter side) of the chip 10 which is elongated from an end of the first side toward the second side by a predetermined length, and a region on the third side (shorter side) of the chip 10 which is elongated from an end of the second side toward the first side by the predetermined length are allocated as the DQ pad regions 13-3 and 13-2, respectively. A region on the fourth side facing the third side, which is elongated from an end of the first side toward the second side by the predetermined length, and a region on the fourth side which is elongated from an end of the second side toward the first side by the predetermined length are allocated as the DQ pad regions 13-1 and 13-4, respectively. The command/address pad region 12 is disposed between the DQ pad regions 13-3 and 13-2, on the third side (shorter side) of the chip 10.

Figure 4:
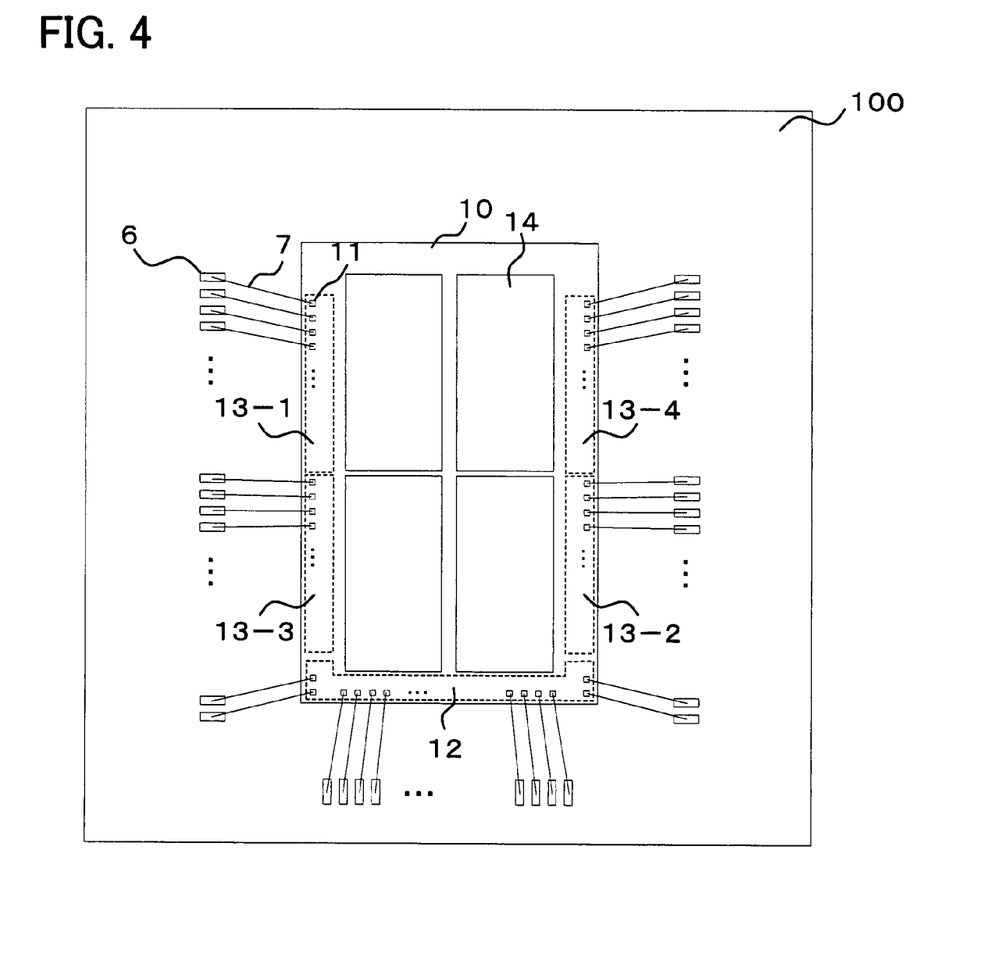
FIG. 4 is a diagram showing a configuration of a third example of the present invention.

FIG. 4 is a diagram showing a configuration of a third example of the present invention. As shown in FIG. 4, in this example, the command/address pad region is extended to parts of regions on the longer sides, in addition to the region on the third side (shorter side) in FIG. 1. More specifically, a region on the first side (longer side) which is elongated from an end of the third side toward the fourth side by a predetermined length, and a region on the second side (longer side) which is elongated from an end of the third side toward the fourth side by the predetermined length are allocated as the command/address pad regions 12.

According to this example described above, assignment of the bond fingers is not dense. Accordingly, still another bond and finger can be added, in addition to the DQ bond fingers. By assigning the added bond finger to the power supply VDD/VSS, VDDQ/VDDS, or the like, the power supply can be reinforced, thus allowing the semiconductor device to be suited to a faster operation.

According to this example, DQ signal wiring lengths (propagation delay times) on the package may be made identical. A timing margin at a time of a high-speed operation of the DDR DRAM or the like may be thereby increased.

Margin is generated in the bond finger arrangement regions for the DQ on the chip-mounted surface of the substrate (substrate surface), and the power supply reinforcement thereby becomes possible. For this reason, an effective inductance for a DQ signal is reduced, and signal quality of a data output signal and the timing margin can be improved, thus contributing to improvement in a DRAM data transfer rate.

The four DQ pad regions are arranged in four blocks obtained by dividing the chip into the four blocks, respectively. Thus, IO circuits may be arranged with satisfactory symmetry. Timing adjustment for the DQ signals on the chip is facilitated, thereby contributing to improvement in the DRAM data transfer rate.

A practical value of the present invention, which is compliant with specifications of a multi-purpose product in terms of BGA package pin arrangement and also allows achievement of a fast DRAM transfer rate while employing a two-layer printed board, is notably high.

In the examples described above, a description was given, using the package for the ×32DDR DRAM chip as an example. The present invention may be of course applied to other semiconductor chip or the like.

The above description of the present invention was made in connection with the examples described above. The present invention is not limited to the configurations of the examples described above alone, and of course includes various variations and modifications that could be made by those skilled in the art within the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device comprising:
a semiconductor chip; and
a substrate with said semiconductor chip mounted thereon;
said semiconductor chip including:
a first region comprising data signal pads for data signals and a second region comprising data signal pads for data signals being arranged on a first side and a second side of said semiconductor chip, respectively, among first to fourth sides of said semiconductor chip, said first side and said second side of said semiconductor chip facing to each other; and
a region comprising command/address signal pads for command/address signals being arranged on a third side of said semiconductor chip;
said data signal pads and command/address signal pads on said semiconductor chip electrically connected to corresponding bond fingers on a chip-mounted surface of said substrate by bonding wires, respectively; and
said bond fingers including:
a first array of bond fingers and a second array of bond fingers arranged on the chip-mounted surface of said substrate, corresponding to said regions for pads for data signals on said first side and said second side of said semiconductor chip, respectively;
a group of bond fingers arranged on the chip-mounted surface of said substrate, corresponding to said region for pads for command/address signals on said third side of said semiconductor chip.

2. The semiconductor device according to claim 1, wherein said substrate comprises a printed substrate including: first and second conductive layers; and
a land for an electrode connected to a through hole via a wiring pattern, on a surface opposite to said chip-mounted surface; said land being led out to said chip-mounted surface via said through hole and connected to a corresponding one of said bond fingers via a wiring pattern on said chip-mounted surface.

3. The semiconductor device according to claim 1, wherein each of said first and second regions comprising data signal pads for data signals is divided into plural sets of regions comprising data signal pads for each predetermined number of bits of data signals;
said divided plural sets of regions comprising data signal pads for data signals being symmetrically arranged on said first and second sides of said semiconductor chip, respectively.

4. The semiconductor device according to claim 1, wherein said first and second regions comprising data signal pads for said data signals are respectively extended from said first and second sides to a part of at least one of said third and fourth sides.

5. The semiconductor device according to claim 1, wherein said region comprising command/address pads for said command/address signals is extended from said third side to a part of at least one of said first and second sides.

6. The semiconductor device according to claim 1, wherein said semiconductor chip includes a semiconductor memory.

7. The semiconductor device according to claim 1, wherein said semiconductor chip comprises a semiconductor memory chip including a plurality of memory cell arrays,
wherein said first region comprising data signal pads for data signals comprises a first upper region associated with a first memory cell array of said plurality of memory cell arrays and a first lower region associated with a second memory cell array of said plurality of memory cell arrays, and
wherein said second region comprising data signal pads for data signals comprises a second upper region associated with a third memory cell array of said plurality of memory cell arrays and a second lower region associated with a fourth memory cell array of said plurality of memory cell arrays.

8. The semiconductor device according to claim 7, wherein said first array of bond fingers comprises a first upper array of bond fingers connected by bonding wires to said pads in said first upper region, and a first lower array of bond fingers connected by bonding wires to said pads in said first lower region, and
wherein said second array of bond fingers comprises a second upper array of bond fingers connected by bonding wires to said pads in said second upper region, and a second lower array of bond fingers connected by bonding wires to said pads in said second lower region.

9. The semiconductor device according to claim 8, wherein said bond fingers in said first and second upper arrays and said first and second lower arrays are connected via a first plurality of wiring patterns formed on said chip-mounted surface to a plurality of through holes in said substrate, a plurality of lands being formed on said other surface of said substrate and connected to said plurality of through holes via a second plurality of wiring patterns formed on said other surface.

10. The semiconductor device according to claim 1, wherein said substrate comprises a ball grid array (BGA) substrate including:
   a plurality of data terminals formed on the other surface of the substrate;
   a plurality of wiring patterns formed on the chip-mounted surface and the other surface of the substrate, and electrically connecting the plurality of data terminals to said first and second arrays of bond fingers;
   a plurality of command/address terminals formed on the other surface of the substrate; and
   a plurality of wiring patterns formed on the chip-mounted surface and the other surface of the substrate, and electrically connecting the plurality of command/address terminals to the group of bond fingers.

11. A semiconductor memory comprising:
   first and second regions comprising a plurality of data signal pads for data signals on first and second sides, among first to fourth sides of said semiconductor memory, said first and second sides facing to each other and said third and fourth sides facing to each other;
   a third region comprising a plurality of command/address signal pads for command/address signals on said a third side of said semiconductor memory; and
   a fourth region on said fourth side of said semiconductor memory, the fourth region being not provided with command/address pads for command/address signals such that the command/address pads on said third region are used in common to control said data signals on said first and second sides.

12. The semiconductor memory of claim 11, wherein said fourth region comprises a region on said third side of said semiconductor memory which is opposite the third region.

13. A semiconductor memory comprising:
   first and second regions comprising a plurality of data signal pads for data signals on first and second sides, among first to fourth sides of said semiconductor memory, said first and second sides facing to each other: and
   a region comprising a plurality of command/address signal pads for command/address signals on a third side of said semiconductor memory,
   wherein said first and second regions comprising data signal pads for data signals are respectively divided into plural sets of regions;
   said divided plural sets of regions of said first and second regions comprising data signal pads for data signals being arranged on said first and second sides of said semiconductor memory, respectively.

14. The semiconductor memory according to claim 13, further comprising:
   a region comprising data signal pads for data signals, in at least one of a region on said third side, elongated from an end of said first side toward said second side by a predetermined length, and a region on said third side, elongated from an end of said second side toward said first side by the predetermined length.

15. The semiconductor memory according to claim 14, further comprising:
   a region comprising data signal pads for data signals, in at least one of a region on said fourth side, elongated from an end of said first side toward said second side by a predetermined length, and a region on said fourth side, elongated from an end of said second side toward said first side by the predetermined length, said fourth side facing said third side.

16. The semiconductor memory according to claim 13, comprising:
   a region comprising command/address signal pads for control signals and address signals, in at least one of a region on said first side, elongated from an end of said third side toward said fourth side by a predetermined length, and a region on said second side, elongated from an end of said third side toward said fourth side by the predetermined length, said fourth side facing said third side.

17. A semiconductor device comprising:
   a substrate including first and second layers with a semiconductor memory as defined in claim 13 mounted thereon,
   wherein the first layer of said substrate comprises a plurality of lands for electrodes;
   wherein the second layer of said substrate comprises bond fingers which are wire bonded to pads of said semiconductor memory, respectively, and
   wherein said lands for electrodes on said first layer are led out to said second layer via through holes, respectively, and being connected to corresponding ones of said bond fingers, respectively.

18. The semiconductor device according to claim 17, further comprising:
   an additional bond finger corresponding to at least one of said first and second sides of said semiconductor memory, a power supply for an input/output circuit for said data signals being supplied to said additional bond finger.

19. The semiconductor memory according to claim 13, wherein the third side of the semiconductor memory has a length which is less than a length of the first and second sides.

20. A semiconductor device comprising:
   a substrate including a first surface and a second surface opposite the first surface, the substrate including:
      a first array of bond fingers and a second array of said bond fingers arranged on the first surface; and
      a group of bond fingers arranged on the first surface; and
   a semiconductor chip mounted on the first surface of said substrate, said semiconductor chip including:
      a first side including a first region comprising data signal pads, the first array of bond fingers being connected by bonding wires to said data signal pads in the first region;
      a second side formed opposite the first side and including a second region comprising data signal pads, the second array of bond fingers being connected by bonding wires to said data signal pads in the second region; and
      a third side including a region comprising command/address signal pads, the group of bond fingers being connected by bonding wires to said command/address signal pads.

* * * * *